United States Patent
Alexeev et al.

(10) Patent No.: US 9,229,811 B2
(45) Date of Patent: Jan. 5, 2016

(54) FOLDED CODES FOR CORRECTION OF LATENT MEDIA ERRORS

(71) Applicant: EMC Corporation, Hopkinton, MA (US)

(72) Inventors: Alexander N. Alexeev, Saint-Petersburg (RU); Peter V. Trifonov, Saint-Petersburg (RU)

(73) Assignee: EMC Corporation, Hopkinton, MA (US)

( * ) Notice: Subject to any disclaimer, the term of this patent is extended or adjusted under 35 U.S.C. 154(b) by 87 days.

(21) Appl. No.: 14/167,389

(22) Filed: Jan. 29, 2014

(65) Prior Publication Data

US 2014/0380127 A1    Dec. 25, 2014

(30) Foreign Application Priority Data

Jun. 20, 2013   (RU) .................................. 2013128347

(51) Int. Cl.
  *G11C 29/00* (2006.01)
  *G06F 11/10* (2006.01)
(52) U.S. Cl.
  CPC .................................. *G06F 11/1076* (2013.01)
(58) Field of Classification Search
  None
  See application file for complete search history.

(56) References Cited

U.S. PATENT DOCUMENTS

| | | | |
|---|---|---|---|
| 6,529,997 B1 * | 3/2003 | Debiez et al. ................. | 711/114 |
| 8,850,296 B2 * | 9/2014 | Weingarten et al. .......... | 714/781 |
| 2003/0070042 A1 * | 4/2003 | Byrd et al. .................... | 711/114 |
| 2005/0138284 A1 * | 6/2005 | Cohn et al. .................... | 711/114 |
| 2007/0006019 A1 * | 1/2007 | Chien ............................. | 714/6 |
| 2010/0162044 A1 * | 6/2010 | Sim-Tang et al. .............. | 714/20 |
| 2010/0262755 A1 * | 10/2010 | Becker et al. ................. | 711/103 |
| 2014/0006850 A1 * | 1/2014 | Aliev et al. ................... | 714/6.24 |
| 2014/0331083 A1 * | 11/2014 | Aliev et al. ................... | 714/6.23 |

OTHER PUBLICATIONS

A. Dholakia et al., "A New Intra-Disk Redundancy Scheme for High-Reliability RAID Storage Systems in the Presence of Unrecoverable Errors," ACM Transactions on Storage (TOS), May 2008, 42 pages, vol. 4, No. 1, Article 1.

B. Schroeder et al., "Understanding Latent Sector Errors and How to Protect Against Them," ACM Transactions on Storage (TOS), Sep. 2010, 23 pages, vol. 6, No. 3, Article 9.

* cited by examiner

*Primary Examiner* — Daniel McMahon
(74) *Attorney, Agent, or Firm* — Ryan, Mason & Lewis, LLP

(57) ABSTRACT

Data is obtained at a data storage system. Codewords are generated from the obtained data. The codewords are computed using a folded code and each codeword comprises symbols. The codewords are stored on an array of disks associated with the data storage system in accordance with a codeword symbol mapping that is specified by at least one parameter of the folded code used to generate each codeword.

19 Claims, 3 Drawing Sheets

*FIG. 3*

|  | DISK 0 | DISK 1 | DISK 2 | DISK 3 | DISK 4 | DISK 5 |
|---|---|---|---|---|---|---|
| STRIPE 0 | $c_0^{(0)}$ | $c_1^{(0)}$ | $c_2^{(0)}$ | $c_3^{(0)}$ | $c_4^{(0)}$ | $c_5^{(0)}$ |
|  | $c_6^{(0)}$ | $c_7^{(0)}$ | $c_8^{(0)}$ | $c_9^{(0)}$ | $c_{10}^{(0)}$ | $c_{11}^{(0)}$ |
| STRIPE 1 | $c_0^{(1)}$ | $c_1^{(1)}$ | $c_2^{(1)}$ | $c_3^{(1)}$ | $c_4^{(1)}$ | $c_5^{(1)}$ |
|  | $c_6^{(1)}$ | $c_7^{(1)}$ | $c_8^{(1)}$ | $c_9^{(1)}$ | $c_{10}^{(1)}$ | $c_{11}^{(1)}$ |
|  | ⋮ | ⋮ | ⋮ | ⋮ | ⋮ | ⋮ |
| STRIPE $i$ | $c_0^{(i)}$ | $c_1^{(i)}$ | $c_2^{(i)}$ | $c_3^{(i)}$ | $c_4^{(i)}$ | $c_5^{(i)}$ |
|  | $c_6^{(i)}$ | $c_7^{(i)}$ | $c_8^{(i)}$ | $c_9^{(i)}$ | $c_{10}^{(i)}$ | $c_{11}^{(i)}$ |
|  | ⋮ | ⋮ | ⋮ | ⋮ | ⋮ | ⋮ |

US 9,229,811 B2

FOLDED CODES FOR CORRECTION OF LATENT MEDIA ERRORS

FIELD

The field relates generally to data storage systems, and more particularly to techniques for data encoding in such data storage systems.

BACKGROUND

The increasing amount of data available in digital format requires developing appropriate data storage systems. In many cases, the amount of data to be stored exceeds the capacity of a single disk drive. Furthermore, the reliability of a single drive may not be sufficient for a particular application. This motivates the development of redundant disk arrays such as, for example, a Redundant Array of Independent Disks or RAID. The size of such arrays may vary from a few disks to a few thousand disks. Such arrays employ some kind of error/erasure correcting codes, which provide the redundancy needed to recover the data if one or more of the disks fail.

However, in many cases, a disk remains operational, while only a few blocks on the disk become unreadable. These unreadable blocks are typically discovered when some other disk fails, and the data on remaining disks is being read in order to re-calculate the data on the failed disk. The need to be able to cope with such latent media errors is a main rationale for developing RAID architectures with many parity disks (e.g., RAID-7.3). However, the need to allocate additional parity disks significantly increases the cost of data storage systems.

SUMMARY

Embodiments of the invention provide improved techniques for data encoding in data storage systems.

For example, in one embodiment, a method comprises the following steps. Data is obtained at a data storage system. Codewords are generated from the obtained data. The codewords are computed using a folded code and each codeword comprises symbols. The codewords are stored on an array of disks associated with the data storage system in accordance with a codeword symbol mapping that is specified by at least one parameter of the folded code used to generate each codeword.

In another embodiment, a computer program product is provided which comprises a processor-readable storage medium having encoded therein executable code of one or more software programs. The one or more software programs when executed by a processor implement one or more steps of the above-described method.

In yet another embodiment, an apparatus comprises a memory and a processor operatively coupled to the memory and configured to perform one or more steps of the above-described method.

In a further embodiment, a data storage system comprises an array controller operatively coupled to an array of disks. The array controller is configured to perform one or more steps of the above-described method.

Advantageously, the use of a folded code in accordance with one or more embodiments of the invention provides the ability to avoid data loss when latent media errors are discovered while rebuilding data after one or more disk failures in a RAID-based data storage system.

These and other features and advantages of the present invention will become more readily apparent from the accompanying drawings and the following detailed description.

BRIEF DESCRIPTION OF THE DRAWINGS

FIG. 3 illustrates a methodology for mapping codeword symbols to disks according to an embodiment of the invention.

DETAILED DESCRIPTION

Embodiments of the present invention will be described herein with reference to exemplary computing systems, data storage systems, and associated servers, computers, storage devices and other processing devices. It is to be appreciated, however, that embodiments of the invention are not restricted to use with the particular illustrative system and device configurations shown. Moreover, the phrases "computing system," "processing platform," "data storage system," and "data storage system environment" as used herein with respect to various embodiments are intended to be broadly construed, so as to encompass, for example, private or public cloud computing or storage systems, or parts thereof, as well as other types of systems comprising distributed virtual infrastructure and those not comprising virtual infrastructure. However, a given embodiment may more generally comprise any arrangement of one or more processing devices.

Figure 1:
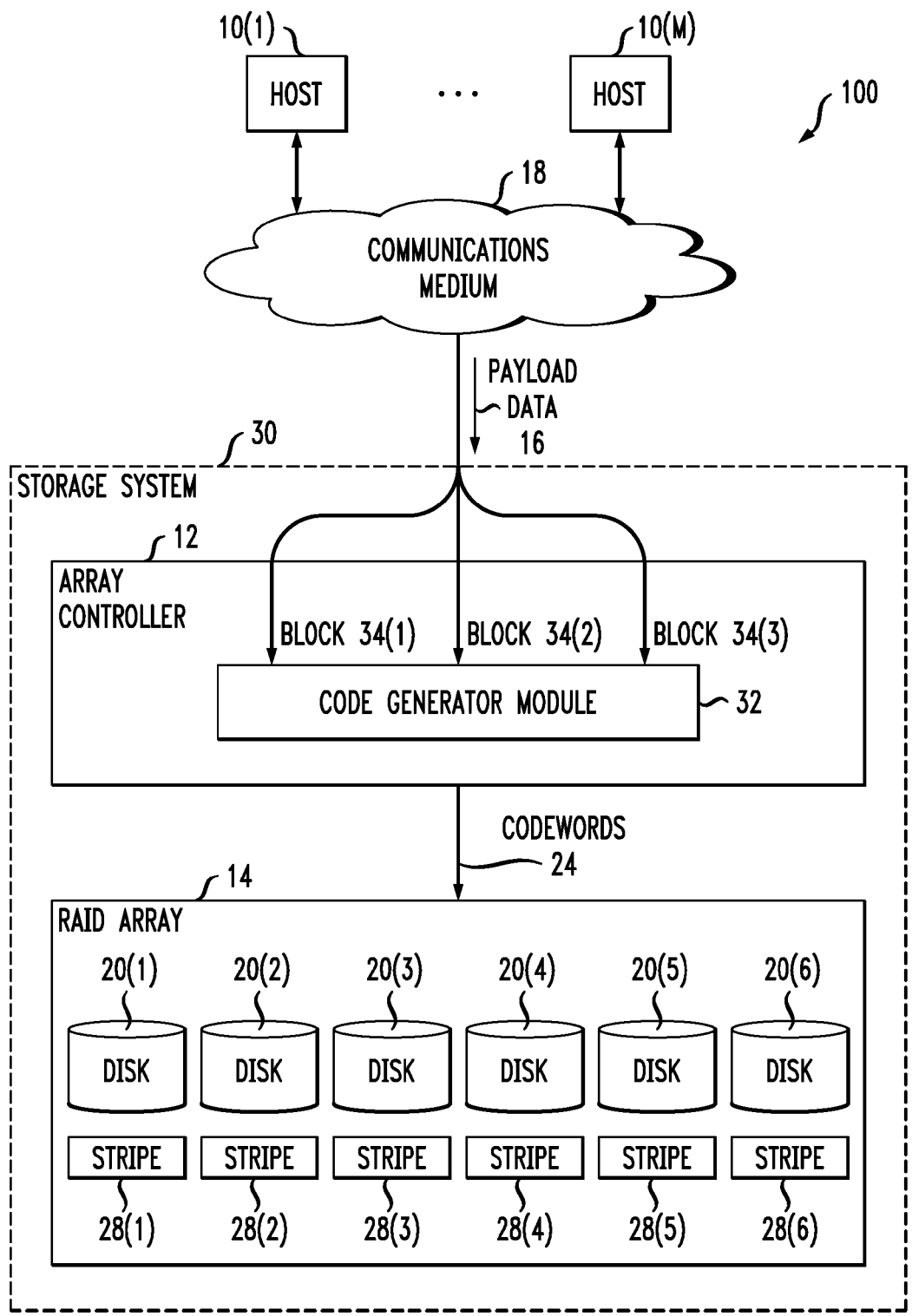
FIG. 1 illustrates a data storage environment according to an embodiment of the invention.

FIG. 1 illustrates an example data storage environment 100 according to an embodiment of the invention. Data storage environment 100 includes a plurality of hosts 10 (1 through M), data storage system 30 and communications medium 18. The storage system 30 includes array controller 12 and RAID array 14. In one example, the hosts 10 are computing devices that issue data read/write requests to the data storage system 30 during the execution of application programs (e.g., a database application) on the hosts 10.

Communication medium 18 provides network connections between the hosts 10 and the data storage system 30. Communications medium 18 may implement a variety of protocols such as Transmission Control Protocol/Internet Protocol (TCP/IP), User Datagram Protocol (UDP), Asynchronous Transfer Mode (ATM), Ethernet, Fibre Channel, Small Computer System Interface (SCSI), combinations thereof, and the like. Furthermore, communications medium 18 may include various components (e.g., cables, switches/routers, gateways/bridges, Network Attached Storage/Storage Area Network (NAS/SAN) appliances/nodes, interfaces, etc.). Moreover, the communications medium 18 is capable of having a variety of topologies (e.g., queue manager-and-spoke, ring, backbone, multi drop, point to-point, irregular, combinations thereof, and so on).

Array controller 12 is constructed and arranged to convert blocks of payload data 16 into various codewords 24 according to one or more code generator matrices in code generator module 32. Array controller 12 is also constructed and arranged to send codewords 24 to disks 20(1) through 20(6) of RAID array 14 for storage. In one example, array controller 12 is a server, although in some arrangements, array controller 12 may be a dedicated unit of a server, a personal computer, a laptop computer, or the like. Array controller 12 includes generator module 32.

Generator module 32 is constructed and arranged to generate codewords 24 from blocks of payload data 16. More particularly, generator module 32 encodes a first block 34(1), a second block 34(2), and a third block 34(3) of payload data 16, including generating parity data for the payload data, using code generator module 32. In one example, generator module 32 is software running on the array controller 12, although in some arrangements, generator module 32 is a stand-alone piece of hardware, or some combination of hardware and software.

RAID array 14 is constructed and arranged to store codewords 24 in disks 20(1) through 20(6). It is to be understood that more or less disks may be employed in the RAID array. It is to be further understood that in order to implement disk load balancing, different stripes may employ different mappings of codeword symbols to the disks, similar to RAID-5.

During operation, array controller 12 receives payload data 16 over communications medium 18. Payload data 16 is broken into blocks 34(1), 34(2), 34(3) (blocks 34) of a given length; in some arrangements, array controller 12 breaks payload data into blocks 34. In turn, generator module 32 takes in each block, 34(1), 34(2), and 34(3), and respectively applies a given generator matrix from its one or more generator matrices to the blocks to create codewords of a given length. It is to be understood that each codeword is typically comprised of information symbols corresponding to payload data and check symbols corresponding to parity data.

Array controller 12 then sends the generated codewords 24 to RAID array 14 to be stored in particular stripes, 28(1) through 28(6), in disks 20(1) through 20(6). Thus, in this example, array controller 12 stores those codewords that have been encoded by the generator module 32. The array controller 12 stores (or causes to be stored) the codewords in the RAID array 14 in accordance with a mapping of codeword symbols to the disks. The code generator module 32, in one embodiment, implements the codeword symbol mapping methodology. In an alternative embodiment, a separate mapping module may be implemented in the array controller. In one embodiment, such a mapping methodology is described below in the context of FIG. 3. Further details of array controller 12 are now described below in the context of FIG. 2.

Figure 2:
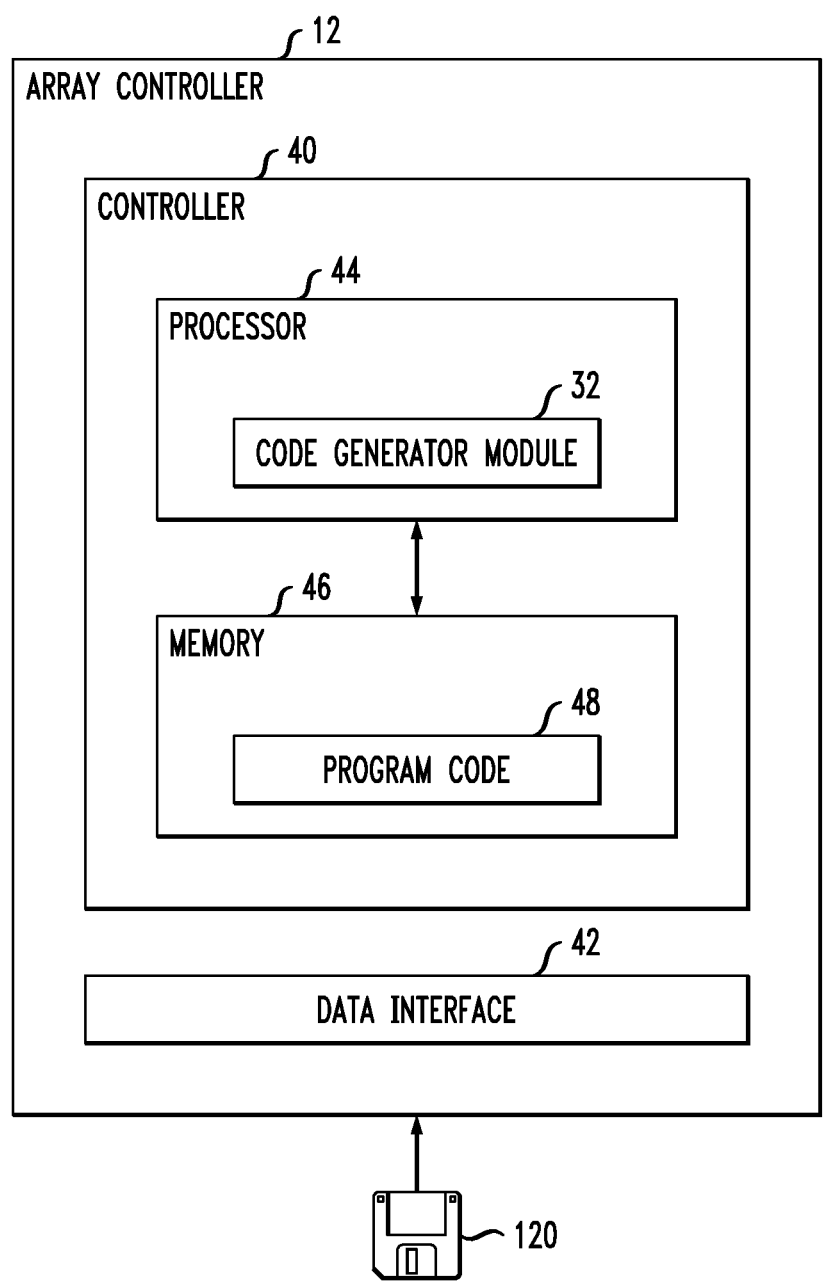
FIG. 2 illustrates an array controller according to an embodiment of the invention.

FIG. 2 illustrates details of an example array controller 12. Array controller 12 includes controller 40, which in turn includes processor 44 and memory 46, and data interface 42, such as a Serial Advanced Technology Attachment (SATA) interface, a Serial Attached SCSI (SAS) interface, a Fiber Channel interface, etc.

Memory 46 is configured to store program code 48 that contains instructions configured to cause processor 44 to carry out methodologies described herein. For example, for array controller 12, program code 48 contains instructions for applying generator matrices to blocks 34 and mapping codeword symbols to disks 20. Memory 46 may take the form of, but is not limited to, random access memory, flash memory or a non-volatile memory.

Processor 44 may take the form of, but is not limited to, one or more central processing units, one or more microprocessors, and a single core or multi-cores each running single or multiple threads. In some arrangements, processor 44 is one of several processors working together. Processor 44 is configured to carry out methodologies and algorithms described herein by executing program code 48. Processor 44 includes generator module 32, although in some arrangements, generator module 32 may be a stand-alone hardware module or software residing in memory. The processor, memory and data interface shown in FIG. 2 comprise one example of a computing device and/or a processing platform upon which methodologies described herein can be implemented.

Given the illustrative data storage system described above, we now describe encoding and codeword symbol mapping methodologies according to embodiments of the invention.

Let n be the number of disks in a given data storage system. Consider a linear block code C of length N=nm and dimension k over alphabet A, where m is a folding parameter associated with a folded code (e.g., a Reed-Solomon folded code). The phrase "folded code" refers to a code where m consecutive symbols from codewords are grouped together, thus m is referred to as the folding parameter. Let $(c_0^{(i)}, \ldots, c_{N-1}^{(i)})$ be a codeword obtained by encoding the i-th chunk of payload data with this code. In one embodiment, symbol $c_j^{(i)}$ is stored on disk $\lfloor j/m \rfloor$, as shown in codeword mapping table 300 of FIG. 3. Note that the mapping table 300 illustrates a folding parameter m=2. However, embodiments of the invention are not limited to this particular folding parameter example. It is to be understood that, in practice, each codeword symbol may correspond to a block of data of some fixed size, which depends on the underlying disk structure (e.g., sector size, etc.) and performance requirements. Note also that if k is not divisible by m, some disks may contain both payload and parity data within the same stripe.

Assume that the code being used is able to correct t erasures. This implies that the encoding and codeword mapping methodology according to this illustrative embodiment is able to tolerate up to τ disk failures and s block errors, provided that s+mτ≤t holds. However, it is to be understood that, in practice, latent media errors may affect a few neighboring disk sectors. In order to avoid exceeding the erasure correcting capability of the code being used, in one embodiment, stripes on disks are interleaved. That is, different pieces of the codeword are stored at sufficiently distant positions on disk, e.g., symbols $c_u$ and $c_{u+n}$ for example considered in FIG. 3.

It is to be appreciated that a maximum distance separable code (e.g., Reed-Solomon) is usable as the code for generating codewords in the above-described methodologies. For such codes, one obtains t=N−k. It can be shown that the encoding and codeword mapping methodologies according to embodiments of the invention achieve a data rate (i.e. usable capacity) of $$R = \frac{k}{nm}.$$

A conventional way to cope with latent media errors is to perform periodically disk scrubbing, i.e., to read the data periodically, and rebuild it if corrupted blocks are discovered. This, however, significantly increases the load of the data storage system, and may degrade its performance. Furthermore, it may take a lot of time to examine all the blocks on all disks, and during this time some new media errors may appear. Another conventional approach is to introduce intra-disk redundancy, i.e., append to a few blocks of data stored on a disk one or more parity blocks, which are stored on the same disk. If the disk is a part of RAID, this construction can be recognized as an instance of a product code of rate ρ=Rr, where R is the rate of the code used in the design of RAID, and r is the rate of the intra-disk code. A main drawback of this conventional approach is that it consumes a significant fraction of disk space for storing parity (check) symbols of the intra-disk code.

Advantageously, embodiments of the invention, e.g., with respect to a RAID-based data storage system with n disks, enables one to avoid data loss if s latent media errors are discovered while rebuilding the data after δ disk failures, provided that the underlying maximum distance separable code satisfies k≤(n−δ)m−s Since, in most cases, the number of latent media errors per stripe s does not exceed 1, it is sufficient to set k=(n−δ)m−1. In this case, the usable capacity achieved by the methodologies of embodiments described herein, $$R = \frac{k}{nm} = \frac{n-\delta}{n} - \frac{1}{nm},$$

exceeds the usable capacity $$R' = \frac{K}{n} = \frac{n-\delta}{n} - \frac{1}{n}$$

of a classical RAID with K=n−δ−1 payload and δ+1 parity, which can also survive such failure configuration. It should be also understood that in the absence of disk failures, this scheme can provide protection against up to δm+s disk failures. For example, in an embodiment based on Reed-Solomon code with parameters m=2, N−k=5, protection against 2 disk failures and 1 latent media error is provided, or 1 disk failure and 3 latent media errors, or 5 media errors and no disk failures. Such an embodiment can be considered as providing an intermediate RAID level between RAID-6 and RAID-7.3.

While various embodiments of the invention have been particularly shown and described, it will be understood by those skilled in the art that various changes in form and details may be made therein without departing from the spirit and scope of the invention as defined by the appended claims.

For example, it should be understood that some embodiments are directed to array controller 12, which is constructed and arranged to store data on a redundant array of disks in a storage system, each disk of the redundant array of disks including a disk controller apart from the array controller. Some embodiments are directed to a process of storing data on a redundant array of disks having an array controller in a storage system, each disk of the redundant array of disks including a disk controller apart from the array controller. Also, some embodiments are directed to a computer program product which enables computer logic to store data on a redundant array of disks having an array controller in a storage system, each disk of the redundant array of disks including a disk controller apart from the array controller.

It should also be understood that some embodiments are directed to array controller 12, which is constructed and arranged to store data in a redundant disk array that employs a code which transforms an information vector of information symbols into a codeword of code symbols. Embodiments are directed to a process of storing data in a redundant disk array that employs a code which transforms an information vector of information symbols into a codeword of code symbols.

In other arrangements, array controller 12 is implemented by a set of processors or other types of control/processing circuitry running software. In such arrangements, the software instructions can be delivered, within array controller 12, either in the form of a computer program product 120 (see FIG. 2) or simply instructions on disk or in pre-loaded in memory 46 of array controller 12, each computer program product having a computer readable storage medium which stores the instructions in a non-volatile manner. Alternative examples of suitable computer readable storage media include tangible articles of manufacture and apparatus such as CD-ROM, flash memory, disk memory, tape memory, and the like.

What is claimed is:

1. A method comprising steps of:
   obtaining data at a data storage system;
   generating codewords from the data, wherein the codewords are computed using a folded code and each codeword comprises symbols; and
   storing the codewords on an array of disks associated with the data storage system in accordance with a codeword symbol mapping that is specified by a folding parameter used to generate each codeword;
   wherein the folded code comprises a set of dimensions defined as a function of a number of disks in the array of disks, a number of disk failures tolerated by the folded code, the folding parameter and a number of latent media errors per stripe.

2. The method of claim 1, wherein the storing step further comprises interleaving stripes on the disks of the array of disks.

3. The method of claim 1, wherein the folded code comprises k dimensions such that k=(n−δ)m−s, where n is the total number of disks in the array of disks, δ is the maximal number of disk failures tolerated by the folded code, m is the folding parameter, and s is the number of latent media errors per stripe.

4. The method of claim 1, wherein the folded code comprises a maximum distance separable code.

5. The method of claim 4, wherein the maximum distance separable code comprises a Reed-Solomon code.

6. The method of claim 1, wherein the symbols of each codeword comprise information symbols and check symbols.

7. A computer program product comprising a non-transitory processor-readable storage medium having encoded therein executable code of one or more software programs, wherein the one or more software programs when executed by a processor implement the steps of the method of claim 1.

8. An apparatus, comprising:
   a memory; and
   a processor operatively coupled to the memory and configured to:
   obtain data at a data storage system;
   generate codewords from the data, wherein the codewords are computed using a folded code and each codeword comprises symbols; and
   store the codewords on an array of disks associated with the data storage system in accordance with a codeword symbol mapping that is specified by a folding parameter used to generate each codeword;
   wherein the folded code comprises a set of dimensions defined as a function of a number of disks in the array of disks, a number of disk failures tolerated by the folded code, the folding parameter and a number of latent media errors per stripe.

9. The apparatus of claim 8, wherein the processor is further configured to perform the storing step by interleaving stripes on the disks of the array of disks.

10. The apparatus of claim 8, wherein the folded code comprises k dimensions such that k=(n−δ)m−s, where n is the total number of disks in the array of disks, δ is the maximal number of disk failures tolerated by the folded code, m is the folding parameter, and s is the number of latent media errors per stripe.

11. The apparatus of claim 8, wherein the folded code comprises a maximum distance separable code.

12. The apparatus of claim 11, wherein the maximum distance separable code comprises a Reed-Solomon code.

13. The apparatus of claim 8, wherein the symbols of each codeword comprise information symbols and check symbols.

14. A data storage system comprising:
an array controller; and
an array of disks operatively coupled to the array controller;
wherein the array controller is configured to: obtain data; generate codewords from the data, wherein the codewords are computed using a folded code and each codeword comprises symbols; and send the codewords to the array of disks for storage in accordance with a codeword symbol mapping that is specified by at least a folding parameter used to generate each codeword;
wherein the folded code comprises a set of dimensions defined as a function of a number of disks in the array of disks, a number of disk failures tolerated by the folded code, the folding parameter and a number of latent media errors per stripe.

15. The data storage system of claim 14, wherein the storing step further comprises interleaving stripes on the disks of the array of disks.

16. The data storage system of claim 14, wherein the folded code comprises k dimensions such that $k=(n-\delta)m-s$, where n is the total number of disks in the array of disks, $\delta$ is the maximal number of disk failures tolerated by the folded code, m is the folding parameter, and s is the number of latent media errors per stripe.

17. The data storage system of claim 14, wherein the folded code comprises a maximum distance separable code.

18. The data storage system of claim 17, wherein the maximum distance separable code comprises a Reed-Solomon code.

19. The data storage system of claim 14, wherein the symbols of each codeword comprise information symbols and check symbols.

\* \* \* \* \*